United States Patent
Poelma et al.

(10) Patent No.: US 9,576,882 B2
(45) Date of Patent: Feb. 21, 2017

(54) THROUGH POLYMER VIA (TPV) AND METHOD TO MANUFACTURE SUCH A VIA

(71) Applicant: Technische Universiteit Delft, Delft (NL)

(72) Inventors: Regnerus Hermannus Poelma, Delft (NL); Henk van Zeijl, Delft (NL); Guoqi Zhang, Delft (NL)

(73) Assignee: TECHNISCHE UNIVERSITEIT DELFT, Delft (NL)

(*) Notice: Subject to any disclaimer, the term of this patent is extended or adjusted under 35 U.S.C. 154(b) by 0 days.

(21) Appl. No.: 14/788,275

(22) Filed: Jun. 30, 2015

(65) Prior Publication Data

US 2015/0303131 A1  Oct. 22, 2015

Related U.S. Application Data

(63) Continuation of application No. PCT/NL2013/050888, filed on Dec. 11, 2013.

(30) Foreign Application Priority Data

Jan. 2, 2013 (NL) ..................... 2010077

(51) Int. Cl.
| | |
|---|---|
| H01L 21/00 | (2006.01) |
| H01L 23/48 | (2006.01) |
| H01L 23/498 | (2006.01) |
| H01L 21/48 | (2006.01) |
| H01L 23/538 | (2006.01) |
| H01L 25/10 | (2006.01) |
| H01L 21/56 | (2006.01) |

(Continued)

(52) U.S. Cl.
CPC ......... *H01L 23/481* (2013.01); *H01L 21/486* (2013.01); *H01L 21/568* (2013.01); *H01L 21/76898* (2013.01); *H01L 23/49811* (2013.01); *H01L 23/49827* (2013.01); *H01L 23/49866* (2013.01); *H01L 23/5384* (2013.01); *H01L 23/5389* (2013.01); *H01L 24/24* (2013.01); *H01L 24/82* (2013.01); *H01L 24/96* (2013.01); *H01L 25/105* (2013.01); *H01L 2224/04105* (2013.01); *H01L 2224/24137* (2013.01); *H01L 2924/12044* (2013.01); *H01L 2924/181* (2013.01)

(58) Field of Classification Search
CPC ...................................... H01L 23/48
See application file for complete search history.

(56) References Cited

U.S. PATENT DOCUMENTS

| | | | | |
|---|---|---|---|---|
| 5,431,328 A | * | 7/1995 | Chang | ..... H01L 24/10 228/106 |
| 2002/0187591 A1 | * | 12/2002 | Bai | ..... H01L 21/563 438/126 |

(Continued)

FOREIGN PATENT DOCUMENTS

| | | |
|---|---|---|
| WO | 2006/039633 | 4/2006 |
| WO | 2014/107108 | 7/2014 |

*Primary Examiner* — William Harriston
(74) *Attorney, Agent, or Firm* — Peacock Myers, P.C.; Jeffrey Myers

(57) ABSTRACT

Vias for three dimensional (3D) stacking, packaging and heterogeneous integration of semi-conductor layers and wafers and a process for the manufacture of a via, to a via, to a 3D circuit and to a semiconductor device. Vias are interconnects used to vertically interconnect chips, devices, interconnection layers and wafers, i.e., in an out-of-plane direction.

18 Claims, 2 Drawing Sheets

(51) Int. Cl.
    *H01L 23/00*     (2006.01)
    *H01L 21/768*     (2006.01)

(56) References Cited

U.S. PATENT DOCUMENTS

| | | |
|---|---|---|
| 2003/0139032 A1 | 7/2003 | Kung |
| 2003/0173676 A1 | 9/2003 | Horikawa |
| 2006/0267213 A1 | 11/2006 | Ozguz et al. |
| 2008/0170819 A1 | 7/2008 | Kodama et al. |
| 2010/0218986 A1 | 9/2010 | Furuta et al. |

* cited by examiner

THROUGH POLYMER VIA (TPV) AND METHOD TO MANUFACTURE SUCH A VIA

CROSS-REFERENCE TO RELATED APPLICATIONS

This application is a continuation application of Patent Cooperation Treaty Application No. PCT/NL2013/050888, filed on Dec. 11, 2013, which claims priority to Netherlands Patent Application No. 2010077, filed on Jan. 2, 2013, and the specifications and claims thereof are incorporated herein by reference.

STATEMENT REGARDING FEDERALLY SPONSORED RESEARCH OR DEVELOPMENT

Not Applicable.

INCORPORATION BY REFERENCE OF MATERIAL SUBMITTED ON A COMPACT DISC

Not Applicable.

COPYRIGHTED MATERIAL

Not Applicable.

BACKGROUND OF THE INVENTION

Field of the Invention (Technical Field)

The present invention relates to vias for three dimensional (3D) stacking, packaging and/or heterogeneous integration of semiconductor devices and/or wafers. In particular, the invention relates to a process for the manufacture of a via, to a via, to a 3D circuit and to a semiconductor device, including but not limited to a MEMS (Micro-Electro-Mechanical System).

Description of Related Art

Vias are interconnects used to vertically interconnect chips, devices, interconnection layers and wafers, i.e., in an out-of-plane direction. This may be done either electrical, optical or through micro-fluidic channels.

State of the art vias include through-silicon vias (TSVs). TSVs are vias that pass through a silicon wafer in order to establish an electrical connection from the active side to the backside of a die. A disadvantage of TSVs is that significant difficulties are often involved with TSV fabrication such as the conformal coverage of complex surfaces, filling of narrow high-aspect-ratio structures, wafer thinning and cracking of the wafer due to material property mismatch with an interposer (e.g., copper) used to form the electrical connection. Furthermore, accurate placement and the electrical connection of the TSV interposer with an interconnect layer is a challenge in itself.

Another approach is the through mold via (TMV). TMVs are typically formed using a process for epoxy-molding-compound drilling and residue cleaning. Once channels are formed, the vias are completed by filling with solder using for example a screen printing process. This process is not very suitable for 3D integration due to the large diameter of the channel of the via (d≥450 µm), low aspect ratio (1:1) and the high resistance of the solder.

WO 2006/039633 A2 recites a structure and method of making an interconnect element and multilayer wiring board including the interconnect element. US 2006/0267213 A1 recites a stackable tier structure comprising prefabricated high density feedthrough. US 2008/0170819 A1 recites an optical element, packaging substrate and device for optical communication. The packaging substrate has a via with a resin filling and a conductor. US 2003/0139032 A1 recites a metal post manufacturing method. US 2003/0173676 A1 recites a multi-layered semiconductor device and method of manufacturing same. US 2010/0218986 A1 recites a method for manufacturing printed wiring board and printed wiring board.

BRIEF SUMMARY OF THE INVENTION

It is an object of the invention to overcome disadvantages of vias and of via manufacturing processes of the prior art and/or to provide alternatives thereto.

Further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings.

DETAILED DESCRIPTION OF THE INVENTION

Figure 1:
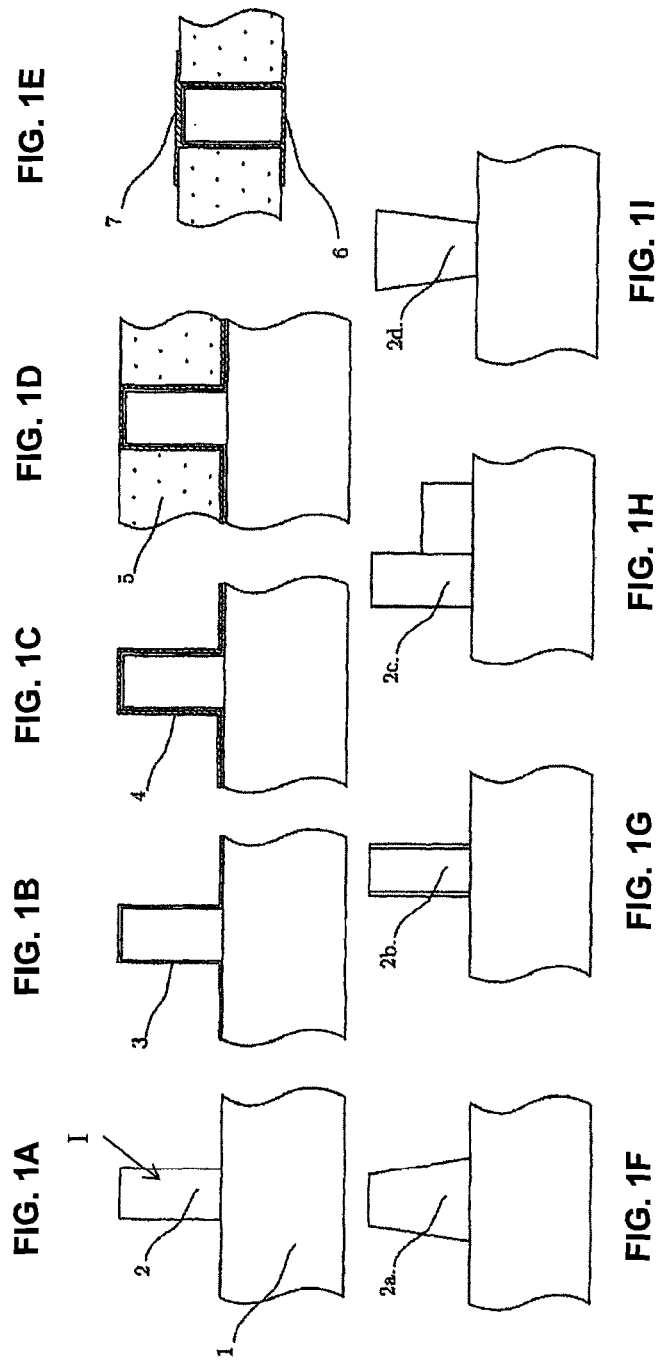
FIGS. 1a-1i show detailed illustrations of a preferred embodiment of the process for the manufacture of a via employing micropillars coated with a first electrically conducting material.

In a first aspect, the invention relates to a process for the manufacture of a via for three dimensional stacking, packaging and/or heterogeneous integration of semiconductor devices and/or wafers comprising: (a) providing a microstructure of polymer on a carrier layer or substrate; (b) coating the microstructure with a layer of a first electrically conducting material to provide a coated microstructure; and (c) encapsulating the coated microstructure within a second electrically insulating material such that the coated microstructure forms an interconnect between upper and lower surfaces of the second electrically insulating material.

This approach to manufacturing vias for three dimensional stacking, packaging and/or heterogeneous integration of semiconductor devices and/or wafers is completely different to state of the art processes such as processes for the manufacture of TSVs and TMVs. The process of the invention puts manufacturing the via first, whereas state of the art processes manufactured the via last.

A notable advantage of the Via 'first' approach of the invention is that the process has room for integration of systems, such as semiconductor devices, microfluidic devices and/or MEMS, together with the via in a single step, namely the step of providing the second electrically insulating material. The process is therefore promising for low-cost, large-scale fabrication. This will be clear from the following description. It is remarked that additional interconnection layers can be placed on either side of the via an on top of the second electrically insulating material.

In a preferred embodiment, the polymer is a photoresist. Examples of suitable photoresists include SU-8 and dry film photoresist laminate.

Particular advantages of using photoresist for the microstructures are that even complex structures can be produced with a high degree of accuracy and reproducibility and with dimensions that match or better the dimensions of the state of the art through mold via (TMV) or silicon via. Furthermore the microstructures can be manufactured simultaneously at low cost and in a brief period of time. The exposure and development of the photoresist can take between 30 and 45 minutes.

Wherein the polymer is a photoresist, providing a microstructure of polymer on a carrier layer or substrate then involves: providing a layer of photoresist on a carrier layer or substrate; patterning (positive or negative depending on whether a positive or negative photoresist is used) the microstructures in the photoresist; exposing the photoresist to a suitable wavelength of radiation (typically UV or even x-ray); exposing the photoresist to a suitable photoresist developer.

As an alternative, prefabricated (dry film) photoresist microstructures, such as blocks of photoresist can be locally placed, for instance by pick and place equipment, so as to further reduce the cost of producing the via of the invention.

The layer of photoresist preferably has a thickness in the range of 100 m to 750 m. In any case, the height and the width of the microstructure at its widest point is preferably such that the microstructure has an aspect ratio greater than 5, more preferably greater than 10, most preferably greater than 15. High aspect ratios are advantageous from the point of view of miniaturization of devices etc. incorporating the via.

In a preferred embodiment, the first electrically conducting material is selected from a group consisting copper, nickel, silver and gold. Coating the microstructures with a layer of copper, nickel, silver or gold is preferably achieved though electro- or electroless-plating, or sputtering and/or evaporation or screen printing. Copper, nickel, silver and gold are excellent conductors and are amenable to electro and electroless plating.

It is noted that most electrically conducting materials provided as per the process of the invention will provide a functioning via. Alternatives to copper, nickel, silver and gold include certain metals and alloys, conductive polymers, conductive ceramics etc. A person of skill in the art is able to identify suitable examples.

In an example, encapsulating the microstructure within a second electrically insulating material such that the microstructure forms an interconnect between upper and lower surfaces of the second electrically insulating material comprises encapsulation in epoxy-molding compound. Epoxy molding compounds are epoxy resins such as Bisphenol A Epoxy Resin. It may also be possible to use ceramics or a silicon material, such as in use for stretchable electronics. Examples of suitable electrically insulating materials for the purpose of the invention are known to a person skilled in the art. Such materials are commonly used in, e.g., packaging in the field of microelectronics.

In a preferred embodiment, the process further comprises a step intermediate to steps (a) providing a microstructure of polymer on a carrier layer or substrate, and (b) coating the microstructures with a layer of a first electrically conducting material, of activating the microstructures of polymer towards the first electrically conducting material such as by providing a seed-layer of a third electrically conductive material.

By activating the polymer towards the first electrically conducting material, the step of coating the microstructures with the material is accelerated.

A purpose of activating the microstructures of polymer towards the first electrically conducting material is to facilitate and improve adhesion between the layers.

Activating the microstructures of polymer towards the first electrically conducting material can take many forms and depends on the particular polymer and first electrically conducting materials. Examples of preferred activation methods are given below with reference to the Drawings. Alternative activation methods include for example surface preparation, surface (chemical) modification and coating.

In a second aspect, the invention relates to a via for three dimensional stacking, packaging and/or heterogeneous integration of semiconductor layers, semiconductor devices, Microsystems and/or wafers comprising a polymer microstructure having a coating of a first electrically conducting material at its surface encapsulated within a second electrically insulating material such that the microstructure forms an interconnect between upper and lower surfaces of the second electrically insulating material. The via of the invention is suitable for application as an electrical interconnect, but may also be applied as optical or microfluidic interconnect, or in general a multi-domain interconnect.

Advantages of via for 3D integration are: shorter total length of interconnections; lower resistance; reductance in signal delay and avoidance of parasitic capacities and inductances. Particular advantages of the via of the invention relate to miniaturization, reduced manufacturing complexity and cost; possibility to create 'complex' microstructures.

In a preferred embodiment the via is a via prepared according to the process of the invention.

In a preferred embodiment, the polymer is a photoresist.

Furthermore, the microstructure preferably has an aspect ratio greater than 5, more preferably greater than 10, most preferably greater than 15.

In a third aspect, the invention relates to a 3D electric circuit having multiple circuit layers wherein the circuit layers are connected by one or more via according to the invention. As mentioned this connection may be electrical, optical or microfluidic.

In a fourth aspect, the invention relates to a device comprising the 3D electric circuit of the invention.

Figure 2:
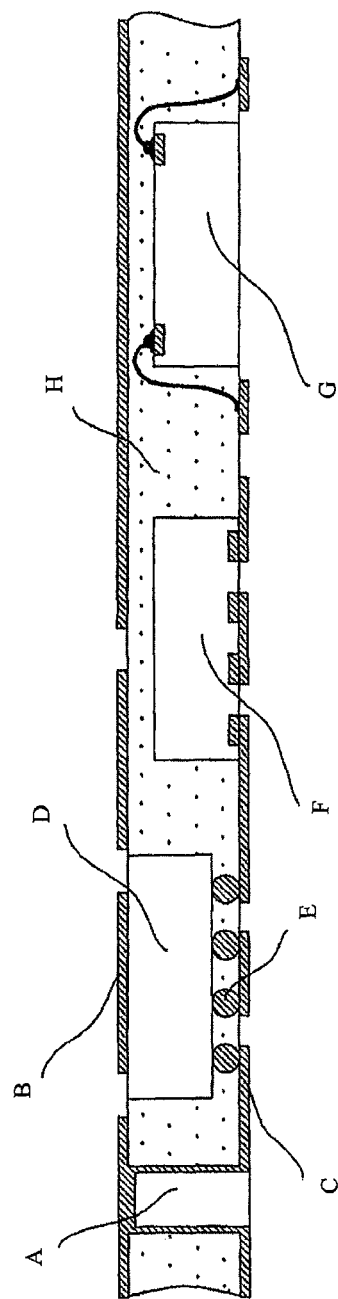
FIG. 2 shows a schematic illustration of an integrated system with the via of the invention.

The invention will now be further elucidated with reference to the drawings of FIGS. 1 and 2. The Figures are provided for illustrative purposes only and are not to be considered as limiting the invention or the appended claims. With reference to FIG. 1:

FIG. 1a. High-aspect ratio micro-pillars 2 are created by patterning a thick photoresist on a layer of substrate 1. Two different types of thick photosensitive films have been tested for micro-pillar fabrication. The first type is the well-known SU-8 negative-tone photoresist that is available in a high-viscosity liquid form with a solvent that can be deposited by, e.g., spinning or injection molding. The second type is dry film photoresist sheets from SUEX. Advantages of the use of dry film photoresist sheets are that application of the sheets to the substrate results directly in a uniform layer of photoresist having a consistent thickness. Suitable thicknesses of photoresist are typically in the range of 100 μm to 750 μm.

The thickness of photoresist layer is determined depending upon the dimensions of the micropillars to be patterned therefrom. It is desirable that the pillars have a high-aspect ratio to facilitate minimizing the dimensions of devices etc. fabricated using a via of the invention.

FIG. 1b. Prior to providing a layer of a first electrically conductive material 4 on the micropillars 2, the micropillars 2 were first activated by providing a layer, suitably a seed-layer 3, on the micropillars.

Different techniques for layer deposition were tested. The techniques were: (i) Physical vapor deposition (PVD) or sputtering; and (ii) atomic-layer deposition (ALD). The seed layer was provided to activate the micropillars towards electro- and electroless plating (respectively) with copper.

Physical vapor deposition (PVD) or sputtering of metallic films such as copper or aluminum onto the pillars was used to create a semi-conformal seed layer at low temperature. PVD was performed at ultra-high vacuum to reduce particle contamination and provide good quality films. The main advantage of this method is that it provides a seed layer that can be directly used for plating purposes since it does not require further activation such as through chemical reaction or otherwise by interacting with further compounds. Furthermore, the sputtered films have excellent adhesion to the substrates on which they are sputtered.

Atomic layer deposition is a self-limiting sequential surface chemistry for the deposition of ultra-thin conformal film. The material used was Titanium nitride (TiN). TiN is electrically conductive, adheres well to metals and has a low processing temperature (<400° C.).

Two different ALD techniques were tested for bringing a thin conformal layer of TiN on the micropillars 2. High-temperature (400° C.) ALD and plasma enhanced ALD, which can be performed at a lower temperature of 150° C.

The result was a conformal layer of TiN, i.e., a third seed layer 3 having a thickness of about 60 nm. Prior to plating the TiN with the first electrically conducting material, the TiN was further activated through surface activation with an HF/Pd solution. The HF is used to remove the surface oxide layers on the TiN for the Pd seeding.

FIG. 1c. A layer of a first electrically conducting material 4 is provided on top of the seed layer 3. Two different methods were then used to provide a layer of a first electrically conducting material 4 on top of the seed layer 3.

For micropillars 2 activated by physical vapor deposition or sputtering, the first electrically conducting material 4, in this case, copper was provided directly by electroplating. To prevent corrosion, a further layer of gold was provided on top of the copper layer by electroless plating.

For micropillars activated by ALD and then further activated with HF/Pd solution, electroless plating was used to deposit a layer or nickel. After nickel plating, a layer of gold was again added to prevent corrosion. For thick-film applications, a layer of copper was then deposited on top of the nickel and gold layers (having a thickness of 5-10 μm) by electroplating and a further film of gold by electroless plating to prevent corrosion.

FIG. 1d. Once the layer of a first electrically conducting material 4 has been provided on the micropillar 2 (and substrate 1) the thus coated micropillar is then encapsulated in a layer of a second electrically insulating material 5. In this example, the electrically insulating material 5 is an epoxy molding compound. The micropillar 2 is encapsulated such that the coated microstructure forms an interconnect between upper and lower surfaces of the second electrically insulating material 5.

FIG. 1e. The completed via A is optionally removed from the substrate and back—6 and top-side 7 interconnect layers are provided (deposited and patterned).

FIG. 1f-i. The micropillars 2 may have a variety of shapes such as 2a-d. Such shapes cannot easily be created with prior art via manufacturing techniques.

With reference to FIG. 2, FIG. 2 shows a schematic illustration of an integrated system with the via of the invention.

The integrated system comprises the via of the invention A; a top interconnect layer B; a bottom interconnect layer C; bare-die with bumps D; solder bumps E; bare-die direct-bond F; bare-die wire bond G; epoxy molding compound H. The epoxy molding compound H is the encapsulating second electrically insulating material 5.

The via of the invention is known as a through-polymer via (TPV).

The TPV is a key technology enabler for 3D integration, packaging and stacking. The TPV provides a signal transmission system for 3D integration and contacts suitable for stacking multiple semiconductor components, Microsystems (MEMS) or for mounting components and systems to a next level substrate. Furthermore, the TPV are suitable for high-volume parallel manufacture. Wherein the polymer is a photoresist, the position of the TPV can be lithographically defined and is therefore extremely accurate. The present invention is therefore providing for low-cost, large scale parallel fabrication of micro-vias for 3D heterogeneous integration and packaging.

The TPV can be applied to: Integrated circuits, semiconductor die, semiconductor devices, micro-processors, micro-electromechanical systems (MEMS), solid-state lighting, LED, OLED and other (high power) electronics where combinations of high pitch, high input/output density, high aspect ratio, low cost, good electromigration performance and low electrical resistance are required. The TPV is also applicable to provide interconnects of microfluidic or optical nature.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A process for the manufacture of a via for three dimensional stacking, packaging and/or heterogeneous integration of semiconductor devices and/or wafers comprising:
    (a) providing a microstructure of polymer on a carrier layer or substrate;
    (b) providing that the microstructure has an aspect ratio greater than 5;
    (c) coating the microstructure with a layer of a first electrically conducting material to provide a coated microstructure; and
    (d) encapsulating the coated microstructure within a second electrically insulating material such that the coated microstructure forms an interconnect between upper and lower surfaces of the second electrically insulating material.

2. The process according to claim 1, wherein the polymer is a photoresist.

3. The process according to claim 1, wherein the microstructure has an aspect ratio greater than 10.

4. The process according to claim 3, wherein the microstructure has an aspect ratio greater than 15.

5. The process according to claim 1, wherein the first electrically conducting material is selected from the group consisting of copper, nickel, silver, and gold.

6. The process according to claim 1, wherein the process further comprises a step intermediate to steps (a) and (b) of activating the microstructures of polymer towards the first electrically conducting material.

7. The process according to claim 6, wherein the process further comprises a step intermediate to steps (a) and (b) of activating the microstructures of polymer towards the first electrically conducting material by providing a seed-layer of a third electrically conductive material.

8. The process according to claim 1, wherein the second electrically insulating material is a polymer or a ceramic material.

9. The process according to claim 8, wherein the second electrically insulating material is an epoxy-molding compound.

10. A via for three dimensional stacking, packaging and/or heterogeneous integration of semiconductor devices and/or wafers comprising an interconnect element of a polymer microstructure, wherein the microstructure has an aspect ratio greater than 5 and has a first electrically conducting material provided as a coating at its surface, the interconnect element of said polymer microstructure with the first electrically conducting material provided at its surface being encapsulated within a second electrically insulating material such that the interconnect element forms an interconnect between upper and lower surfaces of the second electrically insulating material.

11. The via according to claim 10, wherein the interconnect element consists essentially of a microstructure.

12. The via according to claim 10, wherein the interconnect element consists of a microstructure.

13. The via according to claim 10, wherein the polymer is a photoresist.

14. The via according to claim 10, wherein the microstructure has an aspect ratio greater than 10.

15. The via according to claim 14, wherein the microstructure has an aspect ratio greater than 15.

16. The via according to claim 10, wherein the first electrically conducting material is selected from the group consisting of copper, nickel, silver, and gold.

17. A 3D electric circuit having multiple circuit layers wherein the circuit layers are electrically, optically or fluidically connected by at least one via according to claim 10.

18. A semiconductor device comprising the 3D electric circuit of claim 17.

* * * * *